United States Patent
Bhat et al.

(10) Patent No.: US 10,310,039 B2
(45) Date of Patent: Jun. 4, 2019

(54) METHOD AND APPARATUS FOR MULTISLICE MAGNETIC RESONANCE FINGERPRINTING

(71) Applicant: Siemens Healthcare GmbH, Erlangen (DE)

(72) Inventors: Himanshu Bhat, Newton, MA (US); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 115 days.

(21) Appl. No.: 15/585,456

(22) Filed: May 3, 2017

(65) Prior Publication Data

US 2017/0322276 A1    Nov. 9, 2017

(30) Foreign Application Priority Data

May 3, 2016    (DE) .......................... 10 2016 207638

(51) Int. Cl.
   *G01R 33/48*    (2006.01)
   *G01R 33/56*    (2006.01)
   *G01R 33/483*    (2006.01)
   *G01R 33/561*    (2006.01)

(52) U.S. Cl.
   CPC ..... *G01R 33/4835* (2013.01); *G01R 33/4828* (2013.01); *G01R 33/561* (2013.01); *G01R 33/5608* (2013.01)

(58) Field of Classification Search
   CPC ............ G01R 33/4835; G01R 33/4828; G01R 33/5608; G01R 33/561
   See application file for complete search history.

(56) References Cited

U.S. PATENT DOCUMENTS

| | | | | |
|---|---|---|---|---|
| 9,897,675 | B2* | 2/2018 | Setsompop | G01R 33/4828 |
| 2014/0167754 | A1* | 6/2014 | Jerecic | G01R 33/561 |
| | | | | 324/309 |
| 2016/0282430 | A1* | 9/2016 | Gulani | G01R 33/4828 |
| 2016/0349342 | A1 | 12/2016 | Cohen | |

OTHER PUBLICATIONS

Ma et al., "Magnetic resonance fingerprinting," Nature, vol. 495, No. 7440, pp. 187-192 (1971).
Ye et al., "Accelerating Magnetic Resonance Fingerprinting (MRF) Using t-Blipped Simultaneous Multislice (SMS) Acquisition," Magnetic Resonance in Medicine (2015).
Jiang et al., "Use of pattern recognition for unaliasing simultaneously acquired slices in Simultaneous MultiSlice Magnetic Resonance Fingerprinting," Proc. Intl. Soc. Mag. Reson. Med. 23 (2015).

(Continued)

*Primary Examiner* — Rodney A Bonnette
(74) *Attorney, Agent, or Firm* — Schiff Hardin LLP

(57) ABSTRACT

In a method and magnetic resonance (MR) apparatus for combined multislice fingerprinting MR imaging, for each repetition of a repetition sequence, radio-frequency excitation pulses are radiated with flip angles of the radio-frequency excitation pulses being different from one another, at least for a few repetitions. The scattering of the local maxima of the sum of the radio-frequency energy of the radio-frequency excitation pulses as a function of the repetition over the repetition sequence is for example not greater than 80%.

24 Claims, 10 Drawing Sheets

(56) References Cited

OTHER PUBLICATIONS

Griswold et al., "Generalized Autocalibrating Partially Parallel Acquisitions (GRAPPA)," Magnetic Resonance in Medicine, vol. 47, pp. 1202-1210 (2002).
Pruessmann et al., "SENSE: Sensitivity Encoding for Fast MRI," Magnetic Resonance in Medicine, vol. 42, pp. 952-962 (1999).
Setsompop et al., "Blipped-Controlled Aliasing in Parallel Imaging for Simultaneous Multislice Echo Planar Imaging With Reduced g-Factor Penalty," Magn Reson Med., vol. 67, No. 5, pp. 1210-1224 (2012).

* cited by examiner

METHOD AND APPARATUS FOR MULTISLICE MAGNETIC RESONANCE FINGERPRINTING

BACKGROUND OF THE INVENTION

Field of the Invention

The invention concerns a method for magnetic resonance fingerprinting, as well as a corresponding magnetic resonance apparatus, wherein magnetic resonance fingerprinting is combined with (SMS) (Simultaneous Multislice) imaging.

Description of the Prior Art

Magnetic resonance (MR) imaging is based on the excitation and detection of the dynamics of nuclear magnetization in a region under examination of an examination object, for example of a patient. The dynamics of the nuclear magnetization has frequencies in the radio-frequency (RF) spectrum. With conventional MR imaging techniques, the spatial frequency domain (also called k-space) is sampled by (filled with) acquired raw MR data. With a sufficiently dense sampling of the spatial frequency domain, an MR image can be created in the image domain by Fourier transformation of the MR raw data.

Different techniques are known for reducing the time duration (measuring period) needed for MR imaging. For example techniques are known for simultaneously exciting nuclear magnetization in a number of slices of the examination region and for simultaneously acquiring MR data from that number of slices. Such techniques are frequently called SMS (simultaneous multislice) imaging. See for example Setsompop, Kawin et al. "Blipped controlled aliasing in parallel imaging for simultaneous multislice echo planar imaging with reduced g-factor penalty." Magnetic resonance in Medicine 67 (2012) 1210-1224. Conventionally, in order to separate or de-collapse the totality of MR data ink-space into datasets for respective slices, a technique of the type developed for parallel imaging (partial parallel acquisition, ppa) is used, which has a slice-specific reconstruction kernel for each of the slices.

A further technique for reducing the duration of the measurement relates to the use of so-called MR fingerprinting techniques. See Dan Ma et al., "Magnetic Resonance Fingerprinting" Nature 495 (2013) 187-192. In this technique the spatial frequency domain of a slice will be undersampled a number of times, with different parameters of the MR imaging being varied from repetition-to-repetition. Through this variation, a characteristic fingerprint of the MR signal will be obtained. It is then possible, by comparing the MR data from the different repetitions with a fingerprinting directory, to reconstruct an MR image. The directory contains reference data.

Techniques are known that combine fingerprinting imaging with SMS imaging. See Huihui Ye at al., "Accelerating magnetic resonance fingerprinting (MRF) using t-blipped simultaneous multislice (SMS) acquisition" Magn. Reson. Med. (2015); or see Yun Jiang et al., "Use of pattern recognition for unaliasing simultaneously acquired slices in Simultaneous Multislice Magnetic Resonance Fingerprinting" in Proc. Intl. Soc. Mag. Reson. Med. 23 (2015) 0105. In this technique, different parameters of the MR imaging will typically be varied differently for the simultaneously sampled slices, in order to make it possible to separate the MR data for the different simultaneously sampled slices. A slice-specific reconstruction kernel of the ppa imaging does not have to be used.

However such combined SMS fingerprinting imaging has certain disadvantages and restrictions. Typically it is likely, as a result of the variation of the parameters, which the RF energy will vary significantly over the course of a corresponding repetition sequence. This can mean both an especially high level of wear-and-tear for the hardware of the MR system, and the creation of an RF load that can be comparatively high for the patient.

SUMMARY OF THE INVENTION

There is therefore a need for improved combined SMS fingerprinting imaging. In particular a need exists for SMS fingerprinting imaging that overcomes at least a few of the disadvantages stated above.

A method for MR fingerprinting includes a repetition sequence in which, in each repetition a first RF excitation pulse is radiated that excites nuclear magnetization in a first slice of a subject and associated first MR data are acquired. Also in each repetition of the repetition sequence, a second RF excitation pulse is radiated that excites the nuclear magnetization in a second slice, which is different from the first slice, and associated second MR data are acquired. A first MR image of the first slice is determined based on a fingerprinting directory and based on the first MR data. The method also includes the determination of a second MR image of the second slice based on a fingerprinting directory and further based on the second MR data. The radiation (activation) of the first RF excitation pulses and the second RF excitation pulses in the repetitions occurs at least partly in parallel in time. The flip angles of the first RF excitation pulses are, at least for a few repetitions, different from the corresponding flip angles of the second RF excitation pulses. The scattering of the local maxima of the sum of the RF energy of the first RF excitation pulses and of the RF energy of the second RF excitation pulses is, as function of the repetition and over the repetition sequence, not greater than 80%; in this case the scattering is related to an average value of this sum of the RF energy of the first RF excitation pulses and of the RF energy of the second RF excitation pulses over the repetitions of the repetition sequence.

For example it is possible, for each repetition, for the first MR data to sample the spatial frequency domain in the first slice with a specific trajectory. One undersampling of the spatial frequency domain per repetition is possible. It is also possible for the combination of all first MR data over all repetitions to correspond to one undersampling of the spatial frequency domain. The same is true for the second MR data. In exemplary implementations it is possible for the trajectory to be varied from repetition-to-repetition as an MR parameter. For example one or more spiral-shaped trajectories can be used, which are optionally modified in relation to one another.

The repetition sequence can be a temporal sequence of a number of repetitions. The repetition is the amount of time between two consecutive repetitions, i.e. the time between two consecutively radiated-in RF excitation pulses, which excite the nuclear magnetization in the same slice. For example, the repetition time can be varied from repetition-to-repetition as the MR parameter that is varied for the MR fingerprinting. In this case it would be possible for dead times to be inserted so as to vary the repetition time. The repetition sequence can include more than 100 repetitions, preferably more than 500 repetitions, especially preferably more than 1000 repetitions.

The different RF excitation pulses deflect the nuclear magnetization from the rest position that is established as approximately parallel to the basic magnetic field. In this case the different RF excitation pulses can be made slice-selective in relation to a slice in each case, such as by activating a corresponding slice-selection gradient field. The at least partly temporally parallel radiation of the first RF excitation pulse and the second RF excitation pulse for the different repetitions means that a combined SMS-RF excitation pulse or multiband RF excitation pulse, will be determined and radiated. It is also possible for the first and second MR data to be acquired at least partly in parallel in the different repetitions. Through the at least partly temporally parallel acquisition of the first and second MR data, overlaid MR data will be obtained, which must be separated for creating separate MR images of the first and second slices. In this case, the separation can occur on the basis of the fingerprinting directory. For example, the separation can be facilitated by a suitable variation of the MR parameters along the repetition sequence. The variation can be characteristic, for example, for each of the first slice and the second slice, and in this way there can be a separation between the first slice and the second slice for the MR images. Such techniques of SMS imaging are basically known, and thus need not be explained herein in more detail. The method can further include, before the first repetition of the repetition sequence, radiating an RF preparation pulse. Through the use of an RF preparation pulse, an improved sensitivity with respect to variation of the T1 relaxation time and the T2 relaxation time can be achieved.

The fingerprinting directory can feature a large number of predetermined reference dependencies of the MR data on the repetition. The fingerprinting directory thus can be a reference work for the characteristic variation of the MR data over the repetition sequence. In such cases one or more MR parameters can be varied, which can be selected from the following group, for example, repetition time, echo time, trajectory with which the spatial frequency domain will be sampled, flip angle of the RF excitation pulses, etc. These MR parameters can also be associated with properties of the examined material, which can be selected from the following group for example, saturation magnetization, T1 relaxation time, T2 relaxation time, tissue type, etc. The variation can have a pseudo-random component, for example.

The repetition sequence can be repeated for different slices. For example, only the first and second slice can be sampled per repetition sequence, so that an acceleration factor of the SMS imaging assumes a value of 2. More than two slices can be sampled per repetition sequence, such as three or four or five slices.

The amplitude of the RF excitation pulses is correlated with the flip angle or the RF excitation pulses. In this case larger (smaller) amplitudes typically produce larger (smaller) flip angles. The flip angle of the RF excitation pulses is a macroscopic deflection of the magnetization of nuclear spins from the rest position produced by the respective RF excitation pulse. The flip angle of an RF excitation pulses is thus correlated with the RF energy of the respective RF excitation pulse. A larger (smaller) flip angle typically corresponds to a larger (smaller) RF energy. It is possible for the flip angle of the first RF excitation pulses and/or of the second RF excitation pulses to vary for different repetitions or to assume different values, i.e. to vary over the repetition sequence. For example the flip angle of the first RF excitation pulses and of the second RF excitation pulses can vary between around 5° and 80°, preferably between 10° and 60°. The dependency of the flip angle of the first RF excitation pulses and/or of the second RF excitation pulses on the repetition can have a deterministic component, which will be described by a specific function as an example. The function can correspond to a trigonometric function, for example a sine or cosine curve with specific periodicity or periodicities. As an alternative or in addition, the dependency of the flip angle of the first RF excitation pulses and/or of the second RF excitation pulses on the repetition can have a pseudo-random component. The flip angle can be described by the following function, for example:

$$A + \sin(B_i) + R_i$$

In this function A and B are parameters; i indexes the various repetitions; and R is a random component, which assumes different values for different repetitions. The parameter B varies with the length of the period of a corresponding oscillation in the space of the repetitions.

The sum of the RF energy of the first RF excitation pulses and the RF energy of the second RF excitation pulses can be designated as integral RF energy. When more than two slices will be at least partly excited and sampled, the integral RF energy can also take account of these further slices. When the flip angles vary as a function of the repetition, i.e. have a dependency on the repetition, the integral energy also varies as a function of the repetition.

Typically the integral RF energy, on the basis of a corresponding functional dependency of the flip angle of the first RF excitation pulses and of the second RF excitation pulses on the repetition, will assume different values for different repetitions. The integral RF energy can form local maxima and minima. In such cases the local maxima are of great relevance for various affects considered herein. A local maximum of the integral RF energy during the repetition can be present, for example, if the following applies: An interval $I=(i_1, i_2)$ exists, which contains $i_0$, wherein it is true that the integral RF energy for all repetitions in the interval is less than or equal to the integral RF energy during the repetition.

The local maxima are significant for the RF loading of a patient, as well as the requirements of the RF hardware of the MR system. Therefore taking account of these local maxima in conjunction with the scattering is of great relevance.

The scattering can be defined in respect of different measures of scattering. Examples of relevant measures of scattering are for example, the variance, and the standard deviation. The variance is defined as follows:

$$\frac{1}{n-1}\sum_{i=1}^{n}(x_i - \bar{x})^2$$

For example the standard deviation can be defined as follows:

$$\sqrt{\frac{1}{n-1}\sum_{i=1}^{n}(x_i - \bar{x})^2}$$

In these equations n refers to the number of repetitions of the repetition sequence, i indexes the different repetitions; x is the integral RF energy, which is associated with a repetition, and $\bar{x}$ is the average value of the integral RF energy over the n repetitions of the repetition sequence.

Because of the at least partly different flip angle of the first RF excitation pulses, and/or of the second RF excitation pulses a number of effects are achieved. First, it can be possible to carry out a precise determination of the first and second MR images. This can be achieved by the characteristic dependency on the repetition of the flip angles associated with the different slices. Second, it can be possible for the integral RF energy to have a strong dependency on the time or on the repetition.

Through the limitation of the scattering of the local maxima of the integral RF energy, the dependency of the RF energy on the repetition or the time is comparatively low. This makes it possible, in turn, for local peaks in the RF energy to be avoided. Overall this enables more conservative requirements on the RF hardware of the MR system to become possible, such as a lower RF peak power or a lower RF peak power in continuous wave operation.

It has been explained above that the flip angle associated with the different slices can have a dependency on the repetition. As an example, the dependency of the flip angle of the first and second MR excitation pulses on the repetition can be predetermined as a fixed value. A corresponding dependency can be stored permanently by a manufacturer of the MR system in a non-volatile memory, to which a processor of the MR system has access.

In a further example, the dependency of the flip angle of the first and second MR excitation pulses on the repetition can be determined during the operation of the MR system. For example, this dependency can be determined based on different further MR parameters of a corresponding measurement sequence for MR fingerprinting. As an example, this dependency can be determined based on fixed, predetermined relationships. In a further example an appropriate optimization to be carried out.

In an embodiment, for each repetition of the repetition sequence, as before, a first RF excitation pulse is radiated that excites nuclear magnetization in a first slice and associated first MR data are acquired. For each repetition of the repetition sequence, second RF excitation pulse is radiated that excites nuclear magnetization in a second slice, which is different from the first slice, and associated second MR data are acquired. A first MR image of the first slice is determined based on a fingerprinting directory and further based on the first MR data. A second MR image of the second slice is determined based on a fingerprinting directory and based on the second MR data. In this embodiment, the method further includes carrying out a first optimization of the flip angles of the first RF excitation pulses and of second optimization of the flip angles of the second RF excitation pulses. The radiation of the first RF excitation pulses and the second RF excitation pulses occur at least partly in parallel in time. The flip angles of the first RF excitation pulses are different for at least a few repetitions from the corresponding flip angles of the second RF excitation pulses.

The optimization, for example, can be to minimize the scattering of the maxima of the integral RF energy, while one or more boundary conditions are adhered to. Such a boundary condition can be for example, that a difference or a variation of the difference between the flip angles for the RF excitation pulses of the different slices cannot be permitted to fall below a specific threshold value, in order to make an efficient separation of the MR data possible.

Carrying out such an optimization means that a discrepancy situation for the dependency of the flip angles on the repetition can be addressed. For example, it may be worthwhile to implement an especially flexible and independent variation of the flip angles of the first RF excitation pulses and the flip angles of the second RF excitation pulses, so as to undertake an especially good and precise separation of the first and second MR data. It also can be worthwhile to implement the variation of the flip angles of the first RF excitation pulses and the flip angles of the second RF excitation pulses correlated to one another. This can allow the scattering of the local maxima of the sum of the RF energy of the first RF excitation pulses, and of the second RF excitation pulses as a function of the repetition over the repetition sequence, to be is dimensioned small.

For example, different optimization parameters can be taken into account in relation to the first optimization and/or the second optimization. For example, at least one optimization parameter of the first optimization and/or of the second optimization can be selected from the following group: the maximum RF energy of the repetition sequence, the scattering of the local maxima of the sum of the RF energy of the first RF excitation pulses and of the second RF excitation pulses as a function of the repetition over the repetition sequence (i.e. the scattering of the local maxima of the integral RF energy as a function of the repetition over the repetition sequence), the difference between the flip angles in the first RF excitation pulses and the flip angles in the second RF excitation pulses for the different repetitions, and the signal-to-noise ratio of the first MR data and of the second MR data.

It would then be possible to take account of one or more such optimization parameters as a boundary condition of the optimization. As an alternative or in addition it is possible to take account of one or more such optimization parameters as a target value to be optimized during optimization.

For example, the maximum RF energy of the repetition sequence may be limited. In this way, a conservatively-dimensioned RF transmit system of the MR system can be used. At the same time the RF load on the patient can be restricted. Moreover, the use of larger flip angles, which can result in an especially large maximum RF energy, can achieve an especially large signal-to-noise ratio for the MR data.

It is typically desirable for the scattering of the maxima of the integral RF energy as a function of the repetition over the repetition sequence to be small. In this way a uniform scattering of the integral RF energy over the repetition sequence will be achieved. This can have advantages in relation to the RF load on the patient, and bring about a lower stress on the RF hardware of the MR system It is also typically desirable for the difference between the flip angles of the first RF excitation pulses and the flip angles of the second RF excitation pulses to be comparatively large. In this way there can be an especially precise separation of the first and second MR data.

Therefore, it can be worthwhile to implement larger flip angles, because this enables a greater signal-to-noise ratio to be obtained for a specific repetition. Nevertheless, because of the large number of repetitions, a limited maximum flip angle can be useful, in order to obtain residual magnetization, which can be used as a contribution to the magnetization deflection in later repetitions. Therefore, an optimum of the flip angles can exist, which can be established by the optimization.

For example, the dependency of the flip angles of the first RF excitation pulses on the repetition can be complementary to the dependency of the flip angles of the second RF excitation pulses on the repetition.

In this case such a complementary dependency can be achieved by, at least with a few repetitions, different mathematical signs of the change of the dependencies of the flip angles on the repetitions, different magnitudes of dependencies of the flip angles on the repetitions, description of the dependencies of the flip angles on the repetitions by different functions, etc. Through such a complementary dependency, the scattering of the local maxima of the integral RF energy as a function of the repetition over the repetition sequence can be made comparatively small. In addition, there can be an efficient separation of the overlaid MR data.

It is also possible for the dependency of the flip angles of the first RF excitation pulses on the repetition to correspond to the dependency of the flip angles of the second RF excitation pulses on the repetition.

In this case such a corresponding dependency can be achieved by, at least with a few repetitions, the same mathematical sign of the change of the dependencies of the flip angles on the repetitions, the same magnitude dependencies of the flip angles on the repetitions, description of the dependencies of the flip angles on the repetitions by the same functions, etc.

For example it would be possible for the dependency of the flip angles of the first RF excitation pulses on the repetition to be described by a first function, with the dependency of the flip angles of the second RF excitation pulses on the repetition being described by a second function. For example, the first function can correspond to the second function. For example the correspondence of the first function to the second function can be that the first function can be transformed into the second function by simple arithmetical operations, e.g. by adding or subtracting or multiplying or dividing. For example the first function could correspond to a scaled variant of the second function. For example the first function could be the second function multiplied by a scaling factor not equal to one.

As well as such a scaling, it would also be possible for the first function to be displaced in relation to the second function, i.e. to be offset by one or more repetitions.

For example such a displacement of the first and second functions in relation to one another can correlate with a period length of oscillations, which describe the first and second functions. For example such a displacement could be equal to half the period length. Then an especially small scattering of the local maxima of the integral RF energy can be achieved.

For example it is possible for the first function and the second function to feature oscillations as a function of the repetition with corresponding period lengths. The period lengths can thus be defined in the space of the repetitions. For example the period lengths can lie in the order of magnitude of 10 or 20 or 50 or 100 or 200 repetitions.

Preferably, the scattering of the local maxima of the integral RF energy is not greater than 50% in relation to the average value of this sum, further preferably not greater than 20%, especially preferably not greater than 8%. In this way an especially smooth curve of the integral RF energy can be achieved.

As an example, the scattering of the sum of the RF energy of the first RF excitation pulses and the RF energy of the second RF excitation pulses as a function of the repetition over the repetition sequence, can be constrained to not be greater than 80%. In this case the scattering, which can be defined as a scattering measure, as described above, not only takes account of the maxima of the integral RF energy, but also of the complete dependency of the integral RF energy on the repetition over the entire repetition sequence. In this way an especially smooth curve of the integral RF energy can be achieved.

The present invention also encompasses a magnetic resonance apparatus that includes a magnetic resonance data acquisition scanner, having the usual basic components of a basic magnetic field, a gradient coil arrangement, and a radio-frequency antenna arrangement, that is operated by a processor or control computer having a non-volatile memory in which control instructions are stored, that cause the computer or processor to operate the magnetic resonance apparatus in order to implement the method as described above.

The MR system in accordance with the invention achieves advantages that are comparable with the effects that have been described above in relation to the method for MR fingerprinting.

DESCRIPTION OF THE PREFERRED EMBODIMENTS

Figure 1:
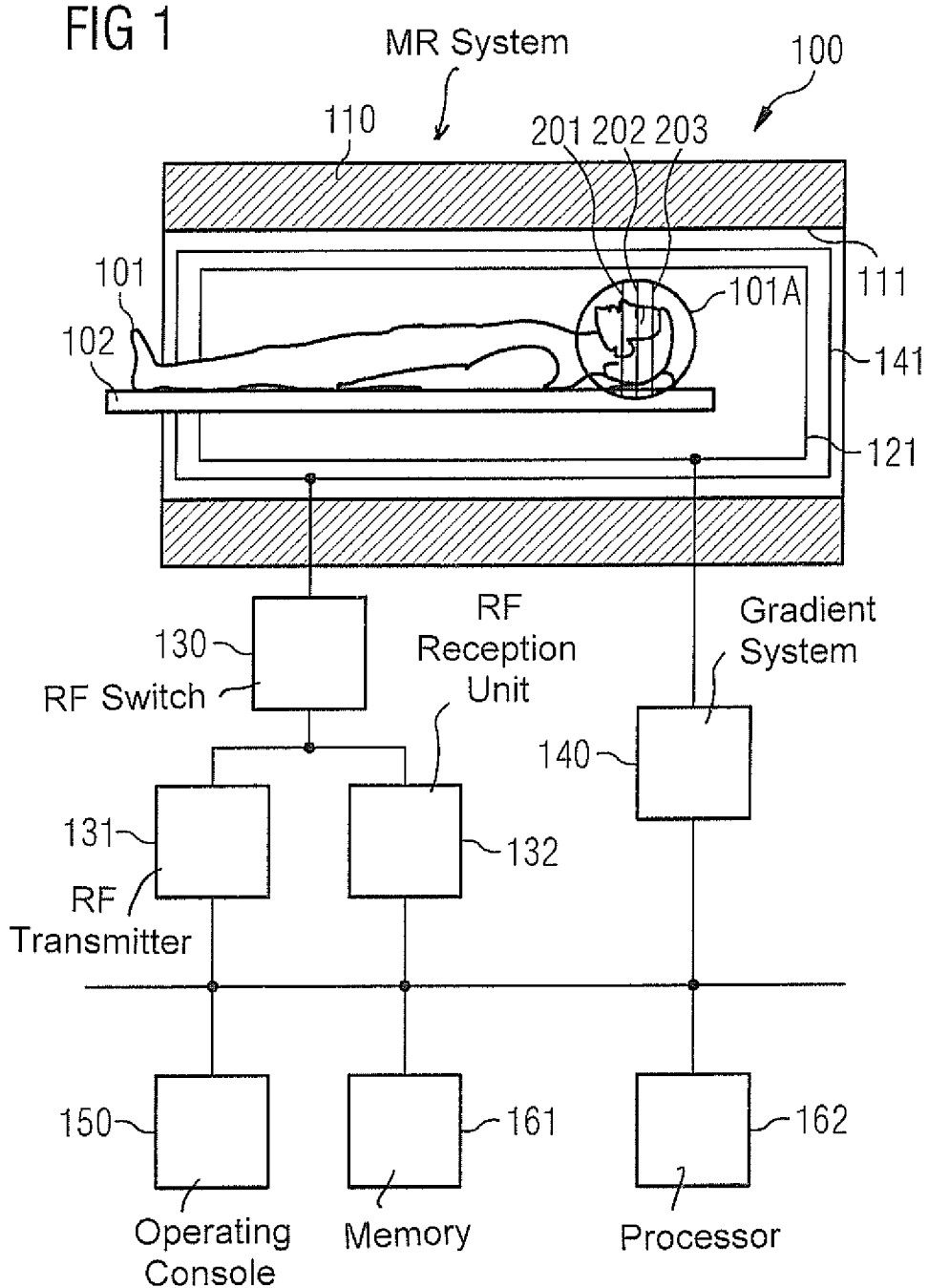
FIG. 1 is a schematic illustration of an MR system in accordance with the invention.

The present invention will be explained in greater detail below on the basis of preferred forms of embodiment with reference to the drawings. In the figures the same reference characters designate the same or similar elements. The figures are schematic representations of different forms of embodiment of the invention. Elements depicted in the figures are not necessarily shown true-to-scale. Instead the various elements depicted in the figures are reproduced such that their function and general purpose will be comprehensible for the person skilled in the art. Connections and couplings shown in the figures between functional units and elements can also be implemented as an indirect connection or coupling. A connection or coupling can be implemented by wire or wirelessly. Functional units can be implemented as hardware, as software or as a combination of hardware and software.

Techniques for MR imaging will be described below. In this description, in various examples, there is a combination of fingerprinting imaging and SMS imaging. Techniques of SMS fingerprinting imaging will thus be described.

In fingerprinting imaging a fingerprinting directory will be used to create MR images from MR data for different MR parameters, wherein the MR data undersample the spatial frequency domain. In order to make possible a precise assignment of the MR data to specific entries in the fingerprinting directory, the MR data will be acquired in this case for a large number of repetitions and different MR parameters will be varied depending on the repetition. The variation of the MR data is then characteristic and can make a precise assignment to the entries of the fingerprinting directory possible, e.g. on the basis of the evolution of the signals in the MR data over the corresponding repetition sequence.

In SMS imaging there is the at least partly temporally-parallel radiation of RF excitation pulses for different slices. A multiband RF excitation pulse can be used for this purpose for example, which corresponds to a superposition of the different, individual RF excitation pulses. As an alternative or in addition to such a temporally-parallel excitation of the nuclear magnetization in the different slices there can also be temporally-parallel acquisition of the MR data. This means that for example gradient echoes of the nuclear magnetization can be formed overlapping in time.

In SMS fingerprinting imaging such techniques of SMS imaging and fingerprinting imaging will be combined with one another, at least in part. In different examples in this case for different repetitions the flip angle for the RF excitation pulses of the different slices excited in parallel in time will be varied differently and characteristically in each case. In particular the dependency of the flip angle for the different RF excitation pulses of the different slices can be embodied such that a coherent scattering of the integral RF energy over the repetition sequence will be made possible. To this end there can be provision for the scattering of the local maxima of the integral RF energy over the repetition sequence to be comparatively small, e.g. less than 80% of a corresponding average value of the integral RF energy. At the same time, however, it can be taken into account that for the separation of the MR data of the various slices sampled in parallel in time a characteristic difference in the signal evolution in the MR data for the repetitions can be worthwhile. To this end an optimization can be carried out, for example, which provides optimized flip angles.

FIG. 1 schematically illustrates an MR system 100, which can be used for carrying out the techniques described above and the techniques which will be described below. The MR system 100 has a data acquisition scanner with a magnet 110, which defines a tunnel 111. The magnet 110 creates the basic magnetic field parallel to its longitudinal axis. The basic magnetic field may exhibit inhomogeneities, i.e. local deviations from a required value.

An examination object, here a person 101 under examination, can be moved on a support table 102 into the magnet 110. An examination region 101A is situated, in the example in FIG. 1, in the region of the head of the person 101 under examination. The examination region 101A includes three slices 201-203. An MR image is to be created for each of the slices 201-203, wherein SMS fingerprinting imaging will be used for this purpose.

The MR system 100 also has a gradient system 140 for creation of gradient fields, which will be used for MR imaging and for spatial encoding of acquired MR data. Typically the gradient system 140 has at least three gradient coils 141 that are individually controllable and that are well defined in terms of their positions in relation to one another. The gradient coils 141 make it possible to apply gradient pulses along specific spatial directions (gradient axes). The gradient fields can be used, for example, for slice selection, for frequency encoding (in the readout direction) and for phase encoding. By this method a spatial encoding of the MR data can be achieved. This enables the spatial frequency domain to be sampled along specific trajectories.

To excite a deviation (deflection) of the nuclear spin magnetization from the longitudinal direction produced in the basic magnetic field, an RF coil arrangement 121 is provided, which can radiate an amplitude-modulated and/or frequency modulated RF excitation pulse into the person 101 under examination. This enables a transverse magnetization to be created. The flip angle of the RF excitation pulse defines the strength of the deflection. Larger (smaller) flip angles typically correspond to a greater (smaller) RF energy. To create such RF excitation pulses an RF transmitter 131 is connected via an RF switch 130 to the RF coil arrangement 121. The RF transmitter 131 includes an RF generator and an RF amplitude demodulation unit. The RF excitation pulses flip the transverse magnetization 1D slice-selectively, or 2D/3D spatially-selectively, or globally from the rest position. Multiband RF excitation pulses can also be radiated these correspond to an overlaying of a number of 1D slice-selective RF excitation pulses in the time domain.

Furthermore, an RF reception unit 132 is coupled via the RF switch 130 to the RF coil arrangement 121. Via the RF reception unit 132, MR signals that occur as a result of the relaxing transverse magnetization are acquired or measured as MR data, e.g. by inductive coupling into the RF coil arrangement 121.

In general it is possible to use separate RF coil arrangements 121 for radiating the RF excitation pulses from the RF transmitter 131 and for the acquisition of the MR data with the RF reception unit 132. For example, a volume coil 121 can be used for radiating RF pulses and a surface coil (not shown), composed of an array of RF coils, can be used for the acquisition of raw MR data. For example, the surface coil used for the acquisition of raw data can have thirty-two individual RF coils and thus be especially suitable for ppa techniques. Suitable techniques are known to those skilled in the art, so further details need not be explained herein.

The MR system 100 also has an operating console 150, which can include a screen, a keyboard, a mouse, etc. for example. Via the operating console 150, user inputs can be accepted and outputs to a user realized. For example, via the operating console 150, for the operator to set individual operating modes of the MR system 100, and/or can set them automatically, and/or by remote control.

The MR system 100 also has a non-volatile memory 161 and a processor 162. The processor 162 is configured to activate the various components 131, 132, 140 in order to carry out a measuring sequence. The processor 162 is also configured to post-process the acquired MR raw data, for example acquired on the basis of SMS imaging and/or fingerprinting imaging. For such tasks the processor 162 receives control instructions from the memory 161 and executes these instructions.

Figure 2:
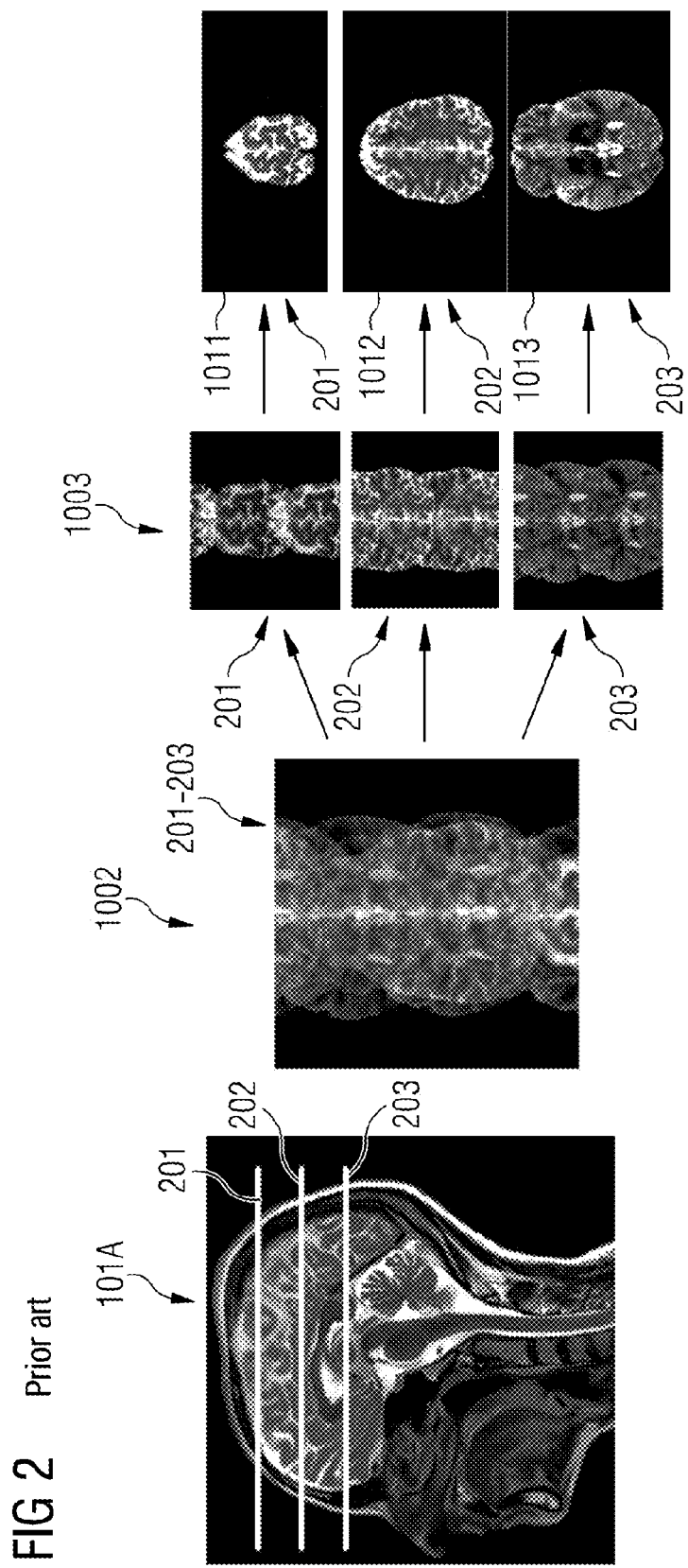
FIG. 2 schematically illustrates a reference implementation of SMS imaging.

FIG. 2 illustrates conventional techniques for SMS imaging. Shown enlarged on the left in FIG. 2 is the examination region 101A, as well as the slices 201-203. In SMS imaging a multiband RF excitation pulse will be irradiated in, which excites the nuclear magnetization in all three slices 201-203 at least partly temporally in parallel. In other examples the multiband RF excitation pulse could excite the nuclear magnetization in just two or in more than three slices.

In addition, the MR data for the three slices 201-203 will be acquired at least partly temporally in parallel. An MR dataset 1002 will be obtained, which corresponds to an overlaying of the MR data for the three slices 201-203 (in FIG. 2, for illustrative reasons, the MR dataset 1002 is shown in the image domain although the MR dataset 1002 will first be acquired in the spatial frequency domain).

In addition to such a temporally parallel excitation and acquisition of MR data, the spatial frequency domain can optionally be undersampled in SMS imaging during acquisition of the MR data. This means that the number of data points of the respective MR data can be smaller than actually needed in the light of the image field. Therefore the MR dataset 1002 includes convolutions. The spatial frequency domain is undersampled on the basis of a ppa technique, for example generalized autocalibrating partially parallel acquisitions (GRAPPA). "Magnetic resonance in medicine 47 (2002 ) 1202-1210; or sensitivity encoding for fast MRI (SENSE) Pruessmann, Klaas P., et. al. "SENSE: sensitivity encoding for fast MRI." Magnetic resonance in medicine 42 (1999 ) 952-962.

First of all, the MR dataset 1002 is separated into the individual MR data 1003, which is assigned to the different slices 201-203. This happens in conventional SMS imaging for example based on a slice-specific reconstruction kernel of the ppa technique used.

It can be seen from FIG. 2 that the MR data 1003 also has convolutions. Based on the ppa technique, the convolutions will be removed to obtain the final MR image 1011-1013 for the different slices 201-203 by reconstruction of non-sampled points of the spatial frequency domain.

Figure 3:
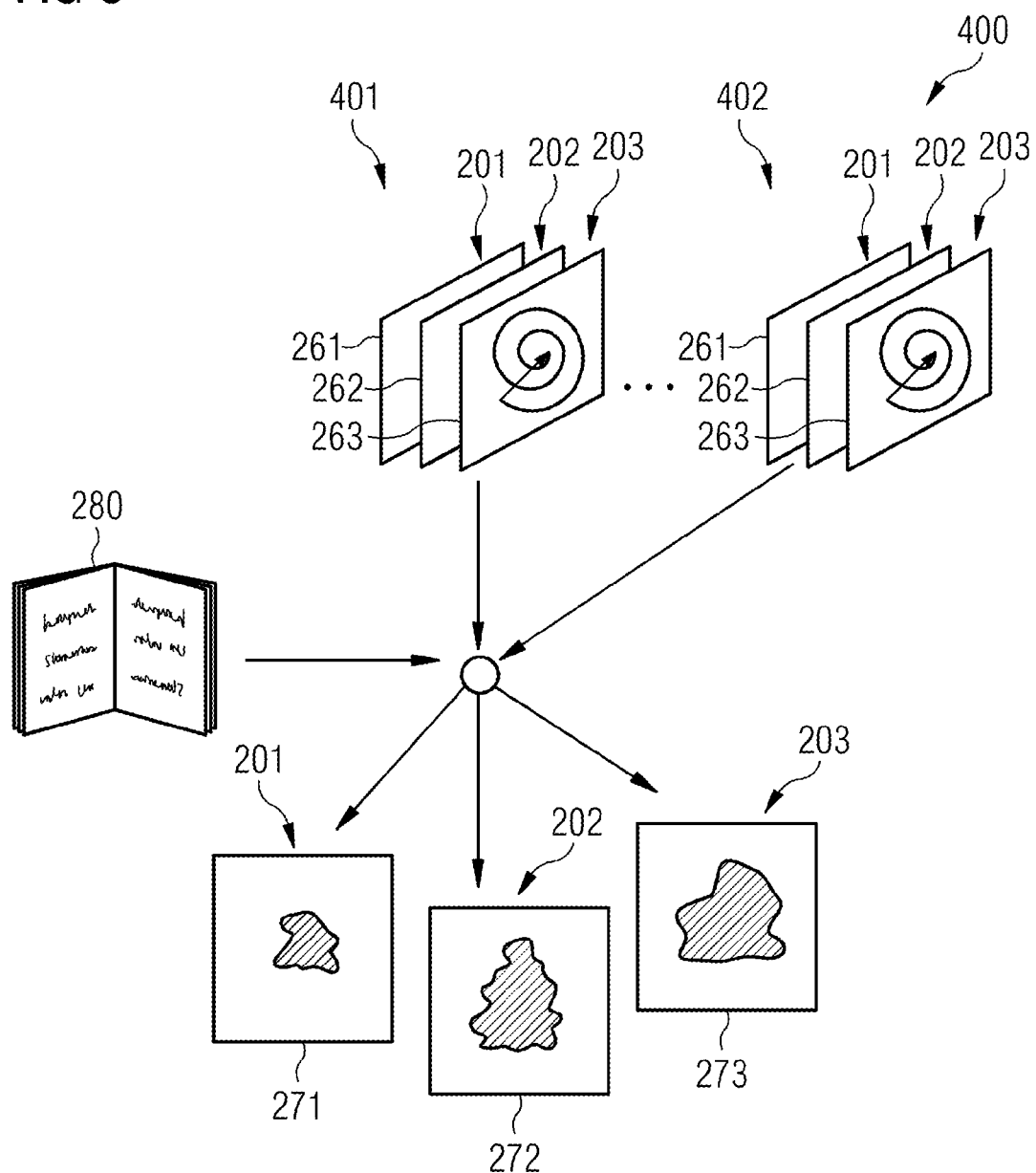
FIG. 3 schematically illustrates a reference implementation of fingerprinting imaging.

FIG. 3 illustrates conventional techniques of fingerprinting imaging. In these techniques MR data 261-263 will be acquired for the different slices 201-203. The excitation and sampling of the nuclear magnetization in the different slices 201-203 can in such cases take place at least partly temporally in parallel based on the techniques of SMS imaging described above. This means that the MR data 261-263 can be present overlaid with one another.

For the different slices 201-203 the spatial frequency domain can be sampled with different trajectories. An example of a trajectory is in the shape of a spiral, as indicated in FIG. 3.

In this case the MR data 261-263 for a number of repetitions 401, 402 (in FIG. 3, for the sake of simplicity, only two repetitions 401, 402 is shown as the number of repetitions) of a repetition sequence 400. For the different repetitions 401, 402 different MR parameters will be varied in each case. In this process the variation of the MR parameters for the different slices 201-203 can have a different dependency on the repetition 401, 402, which encourages a subsequent separation of the MR data 261-263 acquired as overlaid data.

Subsequently, a fingerprinting directory 280 will be used to define MR images 271-273 for the different slices 201-203. In this process, there is the separation of the overlaid MR data 261-263 based on the fingerprinting directory 280. Additionally there is the creation of the MR images 271-273 in the image domain and without convolutions based on the fingerprinting directory 280.

Figure 4:
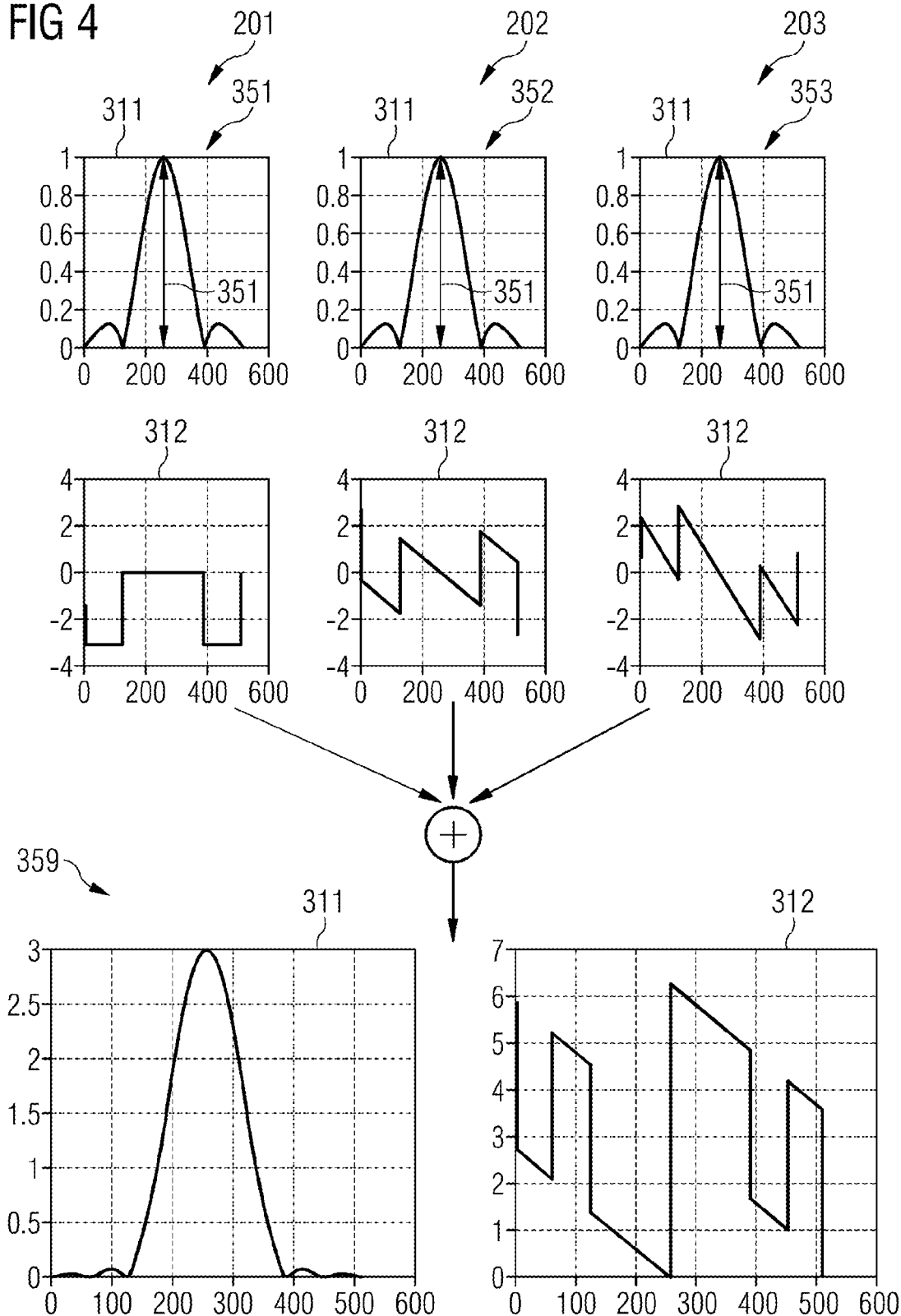
FIG. 4 schematically illustrates a multiband RF excitation pulse in accordance with the invention, wherein the multiband RF excitation pulse is composed of a first RF excitation pulse for a first slice and a second RF excitation pulse for a second slice.

FIG. 4 illustrates aspects in relation to a multiband RF excitation pulse 359. Shown at the bottom in FIG. 4 is the amplitude 311, and also the phase 312 of the multiband RF excitation pulse 359.

The multiband RF excitation pulse 359 is produced from an overlaying of 1D slice-selective RF excitation pulses 351-353, which excite the nuclear magnetization in each case in a corresponding slice 201-203. In the example of FIG. 4 the RF excitation pulses 351-353 all have the same flip angle 351. As can be seen from FIG. 4, the flip angle 351 is proportional to the maximum amplitude 311 of the respective excitation pulse 351-353. The flip angle 351 is also proportional to the RF energy, which is associated with the respective RF excitation pulse 351-353, 359.

Figure 5:
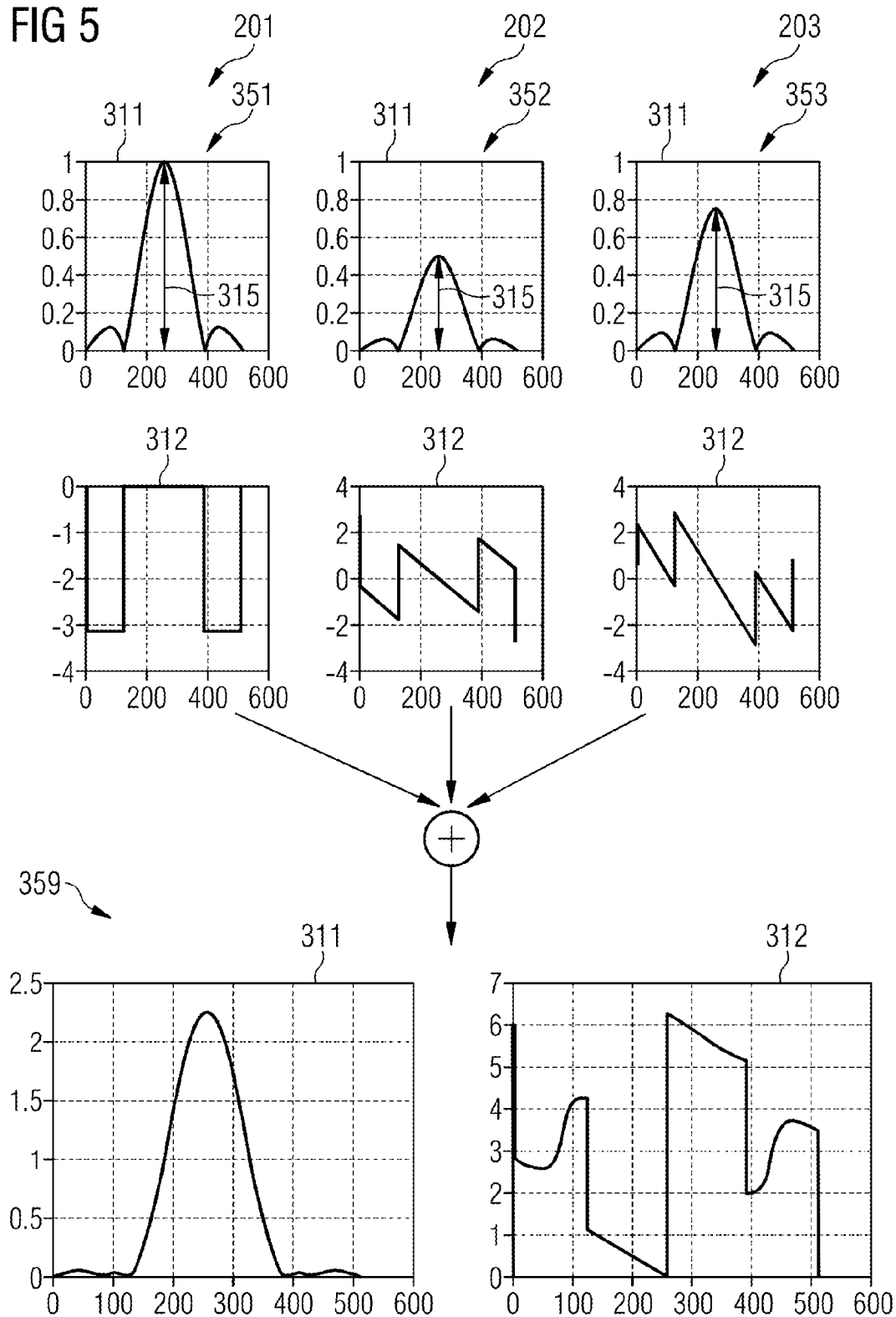
FIG. 5 schematically illustrates a multiband RF excitation pulse in accordance with the invention, wherein the multiband RF excitation pulse is composed of a first RF excitation pulse for a first slice and a second RF excitation pulse for a second slice.

FIG. 5 illustrates aspects in relation to the multiband RF excitation pulse 359. FIG. 5 basically corresponds to FIG. 4. In this figure however the respective RF excitation pulses 351-353 assigned to the different slices 201-203 have differing or different flip angles 315 from one another.

The flip angles 315 shown in FIGS. 4 and 5 can vary for different repetitions. This means that the flip angles 315 can exhibit a dependency on the repetition.

Figure 6:
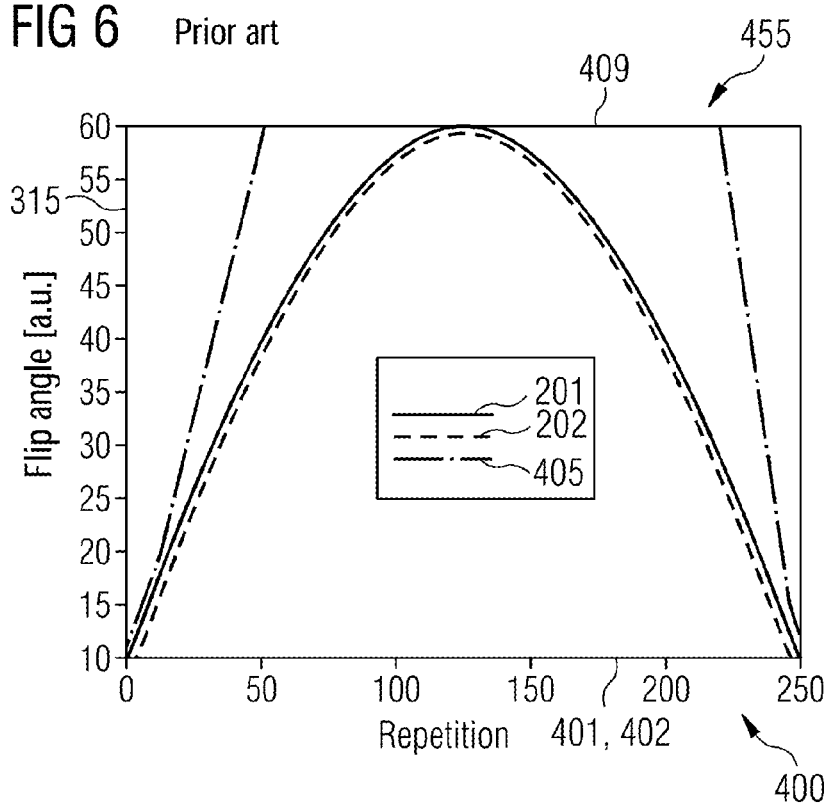
FIG. 6 schematically illustrates the respective dependency of the flip angles of the first RF excitation pulses and the flip angles of the second RF excitation pulses on the repetition in accordance with a reference implementation.

FIG. 6 illustrates aspects in relation to a dependency 455 of the flip angle 315 of the different RF excitation pulses 351-353 on the repetition 401, 402 of the repetition sequence 405 in accordance with a reference implementation. In this figure, for reasons of simplicity, only the first 250 repetitions 401, 402 are shown in FIG. 6. The repetition sequence 400 however includes more than 250 repetitions, for example 1000 or 2000 repetitions 401, 402. The dependency 455 of the flip angle 315, as discussed below, will be repeated for subsequent repetitions 401, 402 (not shown in FIG. 6).

It can be seen from FIG. 6 that the RF excitation pulses 351, 352 for the slices 201, 202 in the different repetitions 401, 402 of the repetition sequence 400, each have the same flip angle 315. In particular the dependency 455 of the flip angle 315 of the RF excitation pulses 351 of the slice 201 is identical to the dependency 455 of the flip angle 315 of the RF excitation pulses 352 of the slice 202 on the repetition 401, 402.

Since in FIG. 6, for the RF excitation pulses 351, 352 for the different repetitions 401, 402, the same flip angles 315 will be used in each case, a separation on the basis of the fingerprinting directory can only have a limited precision 280. In order to still obtain a good separation despite this, it can be necessary for example to implement a greater number of repetitions 401, 402, which in turn lengthens the measurement duration.

Also shown in FIG. 6 is the sum of the RF energy of the RF excitation pulses 351 of the slice 201 and the RF energy of the RF excitation pulses 352 of the slice 202 (dashed and dotted line in FIG. 6), i.e. the integral RF energy. The integral RF energy 405 is proportional to the sum of the flip angles 315 of the two RF excitation pulses 351, 352.

Figure 7:
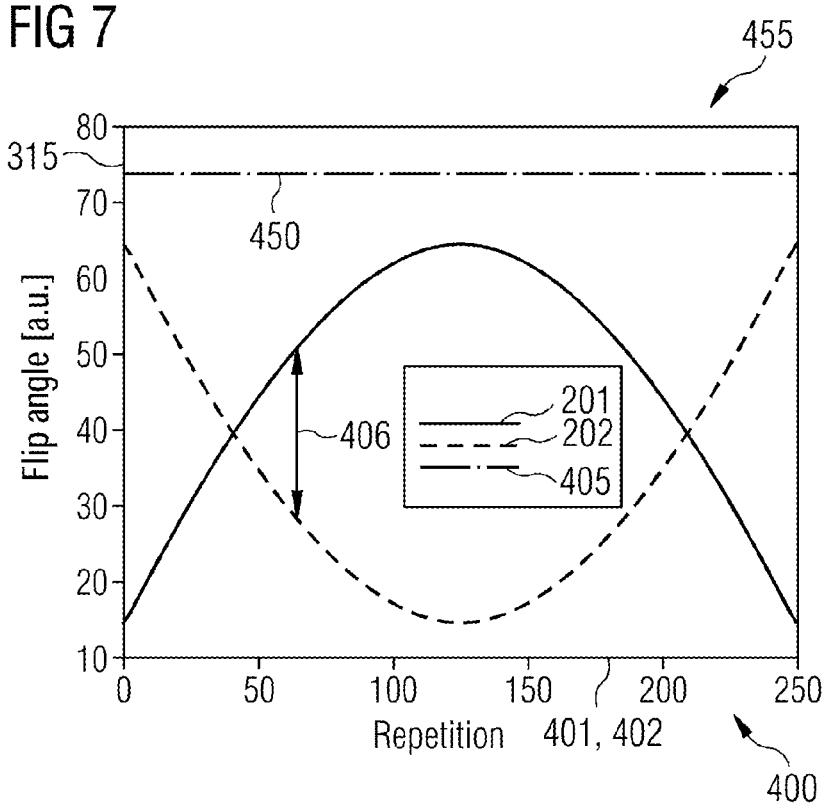
FIG. 7 schematically illustrates the respective dependency of the flip angles of the first RF excitation pulses and the flip angles of the second RF excitation pulses on the repetition, in accordance with the invention.

FIG. 7 illustrates aspects in relation to a dependency 455 of the flip angles 315 of the different RF excitation pulses 351, 352 on the repetition 401, 402 of the repetition sequence 400. In accordance with the techniques described herein, the flip angles 315 of the RF excitation pulses 351 for the slice 201 are different for the plurality of the repetitions 401, 402 from the corresponding flip angles 315 of the RF excitation pulses 352 for the slice 202. A difference 406 between the flip angles 315 thus assumes a value not equal to zero for at least a few repetitions 401, 402. In addition the flip angles 415 of the RF excitation pulses 351 for the slice 201 and the flip angles 415 of the RF excitation pulses 352 for the slice 202 vary.

The integral RF energy 405 is also shown in FIG. 7 (dashed and dotted line). Since in the example of FIG. 7 the dependency 455 of the flip angles 315 of the RF excitation pulses 351 is complementary to the dependency 455 of the flip angles 315 of the RF excitation pulses 352 for the slice 202, the integral RF energy 405, i.e. the sum of the RF energy of the RF excitation pulses 351 for the slice 201 and the sum of the RF energy of the RF excitation pulses 352 for the slice 202, does not vary. Therefore—for example in accordance with the definition of a local maximum given above—the integral RF energy 405 for all repetitions 401, 402 of the repetition sequence embodies a local maximum 450, which always has the same value (approx. "75" in the example of FIG. 7). Therefore a scattering of the local maxima 450 is equal to zero and thus amounts to 0% in relation to the average value of this sum over the different repetitions 401, 402. In the example of FIG. 7 the scattering 460 of the integral energy 405 is especially 0% of this average value.

Figure 8:
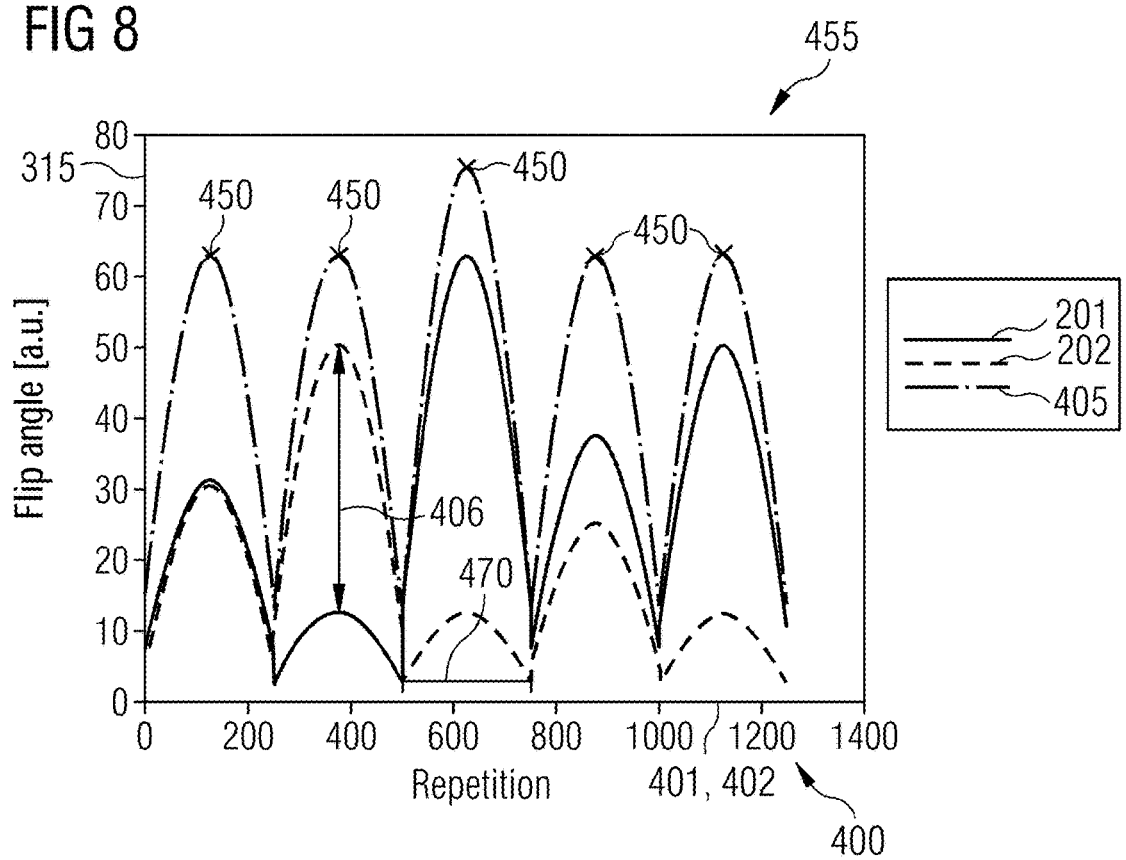
FIG. 8 schematically illustrates the respective dependency of the flip angles of the first RF excitation pulses and the flip angles of the second RF excitation pulses on the repetition, in accordance with the invention.

FIG. 8 illustrates aspects in relation to a dependency 455 of the flip angles 315 of the different RF excitation pulses 351, 352 on the repetition 401, 402 of the repetition sequence 400. In accordance with the techniques described herein, the flip angles 315 of the RF excitation pulses 351 for the slice 201 are different for the plurality of the repetitions 401, 402 from the corresponding flip angles 315 of the RF excitation pulses 352 for the slice 202. A difference 406 between the flip angles 315, thus assumes a value not equal to zero for at least a few repetitions 401, 402. In addition the flip angles 415 of the RF excitation pulses 351 for the slice 201 and the flip angles 415 of the RF excitation pulses 352 for the slice 202 vary.

In the example of FIG. 8 the dependency 455 of the flip angles 315 of the RF excitation pulses 351 for the slice 201 on the repetition 401, 402 corresponds to the dependency 455 of the flip angles 315 of the RF excitation pulses 352 for the slice 202 on the repetition 401, 402. In particular the dependency 455 of the flip angles 315 of the RF excitation pulses 351 for the slice 201 on the repetition 401, 402 will be described by a first function and the dependency 455 of the flip angles 315 of the RF excitation pulses 352 for the slice 202 on the repetition 401, 402 will be described by a second function. The first function corresponds to the second function because the first function and the second function have oscillation as a function of the repetitions 401, 402 with the same period length 470, here with a value of around 230 repetitions. The first function and the second function in this case have different flip angles 315, are thus not identical.

It can further be seen from FIG. 8 that the integral RF energy 405 (shown in FIG. 8 by the dashed and dotted line) has oscillations of the corresponding period length 470. Therefore the integral RF energy 405 has a number of five local maxima 450. The local maxima 450 have different values. Therefore the local maxima 450 possess a finite scattering.

Figure 9:
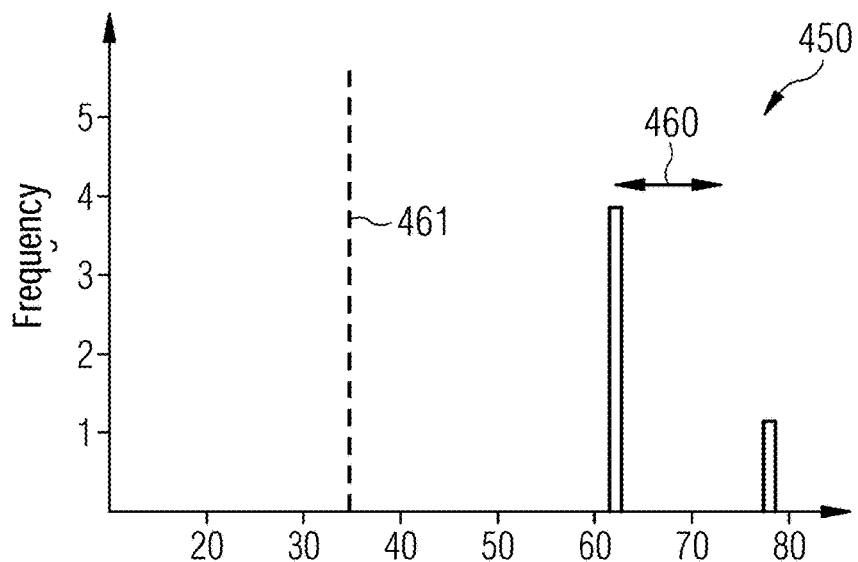
FIG. 9 schematically illustrates the scattering of the local maxima of the integral RF energy as a function of the repetition over the repetition sequence for the dependencies of the flip angles in accordance with FIG. 8.

FIG. 9 illustrates aspects in relation to the scattering 460 of the maxima 450 of the integral RF energy 405 for the dependencies 455 in accordance with FIG. 8. FIG. 9 is a frequency diagram for the values of the maxima 450 of the integral RF energy 405. In FIG. 9 the scattering 460 is plotted. It can be seen from FIG. 9 that the scattering 460 is far lower than an average value 461 of the integral RF energy 405, in particular less than 50% of the average value 461.

Figure 10:
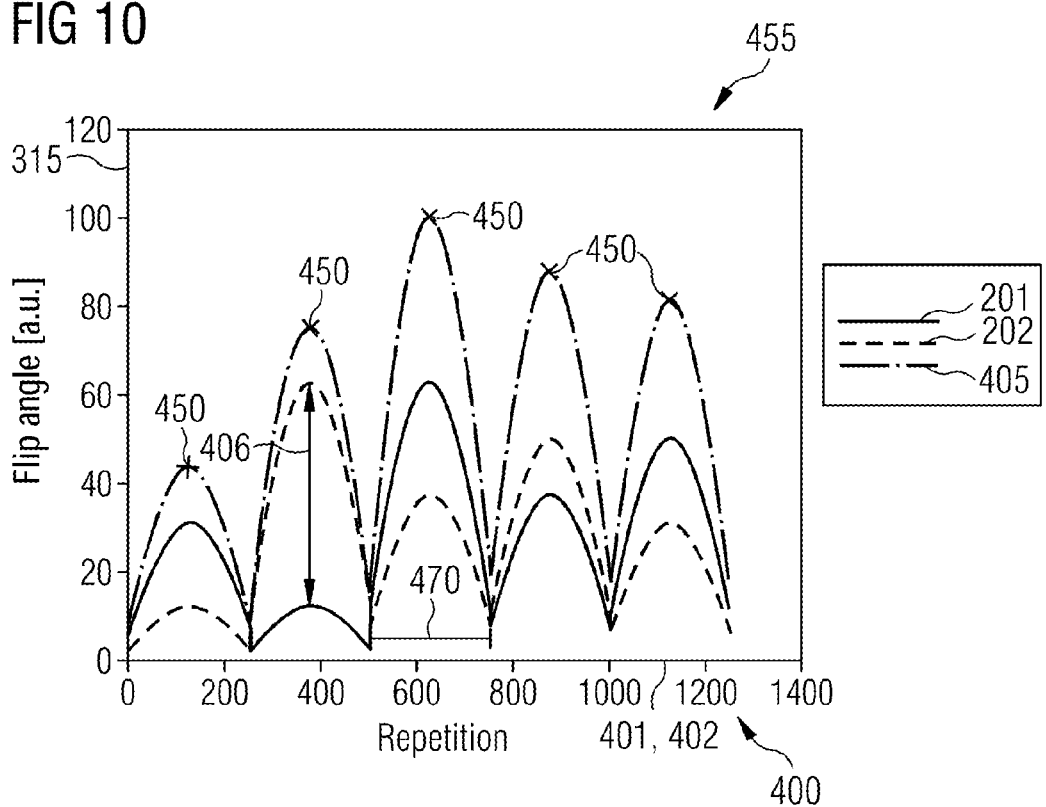
FIG. 10 schematically illustrates the respective dependency of the flip angles of the first RF excitation pulses and the flip angles of the second RF excitation pulses on the repetition in accordance with the invention.

FIG. 10 illustrates aspects in relation to a dependency 455 of the flip angles 315 of the different RF excitation pulses 351, 352 on the repetition 401, 402 of the repetition sequence 400. In accordance with the techniques described herein, the flip angles 315 of the RF excitation pulses 351 for the slice 201 are different for the plurality of the repetitions 401, 402 from the corresponding flip angles 315 of the RF excitation pulses 352 for the slice 202. In addition the flip angles 415 of the RF excitation pulses 351 for the slice 201 and the flip angles 415 of the RF excitation pulses 352 for the slice 202 vary. A difference 406 between the flip angles 315 assumes a value not equal to zero for at least a few repetitions 401, 402.

In the example of FIG. 10, the dependency 455 of the flip angles 315 of the RF excitation pulses 351 for the slice 201 on the repetition 401, 402 corresponds to the dependency 455 of the flip angles 315 of the RF excitation pulses 352 for the slice 202 on the repetition 401, 402. In particular the dependency 455 of the flip angles 315 of the RF excitation pulses 351 for the slice 201 on the repetition 401, 402 will be described by a first function and the dependency 455 of the flip angles 315 of the RF excitation pulses 352 for the slice 202 on the repetition 401, 402 will be described by a second function. The first function is equal to the second function, wherein the first function however is displaced by a number of repetitions 401, 402 compared to the second function. The number of repetitions 401, 402 by which the second function is displaced by comparison with the first function is equal to the period length 470 in this case.

Figure 11:
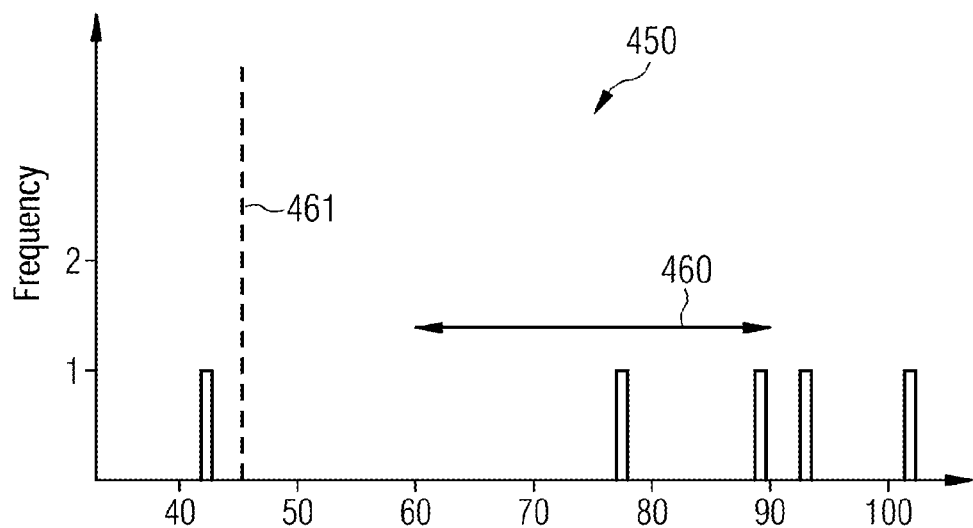
FIG. 11 schematically the invention the scattering of the local maxima of the integral RF energy as a function of the repetition over the repetition sequence for the dependencies of the flip angles in accordance with FIG. 10.

FIG. 11 illustrates aspects in relation to the scattering 460 of the maxima 450 of the integral RF energy 405 for the dependencies 455 in accordance with FIG. 10. FIG. 11 is a frequency diagram for the values of the maxima 450 of the integral RF energy 405. In FIG. 11 the scattering 460 is plotted. It can be seen from FIG. 11 that the scattering is far lower than an average value 461 of the integral RF energy 405, in particular less than 50% of the average value 461.

Figure 12:
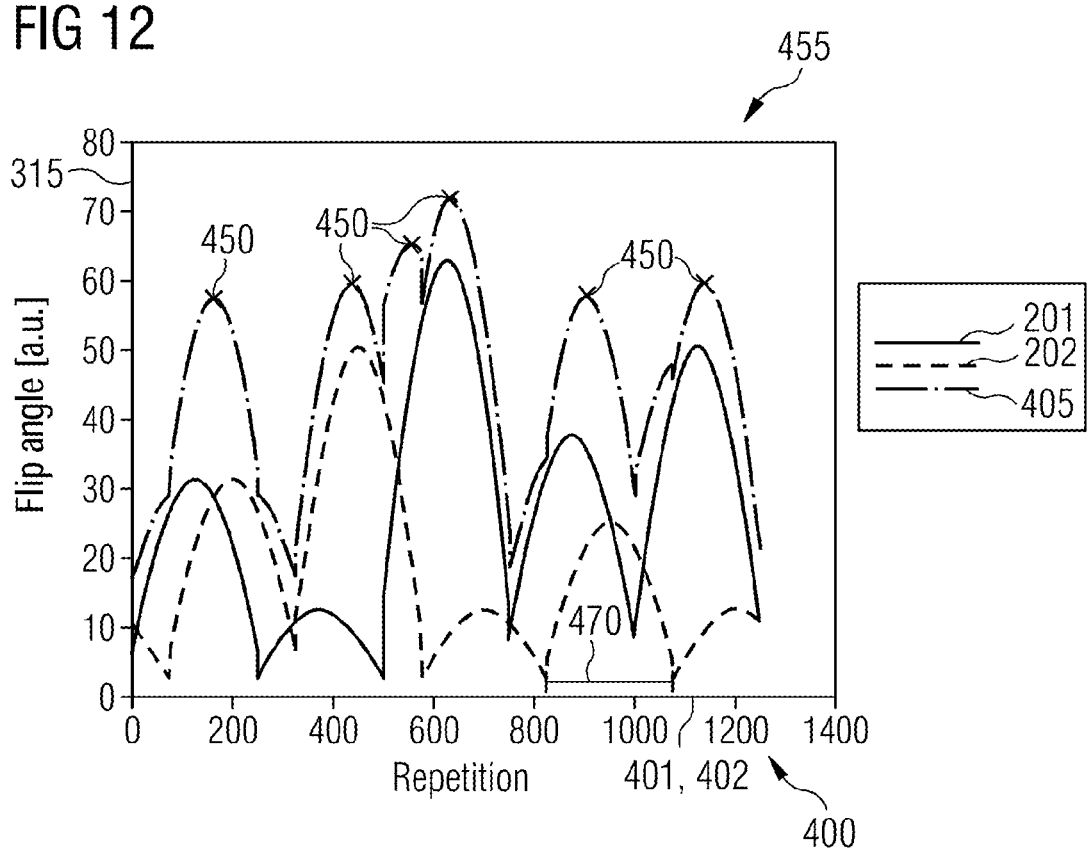
FIG. 12 schematically illustrates the respective dependency of the flip angles of the first RF excitation pulses and the flip angles of the second RF excitation pulses on the repetition in accordance with the invention.

FIG. 12 basically corresponds to FIG. 10, wherein the first function and the second function have the same period lengths 470, but are different from one another and are also displaced from one another.

Figure 13:
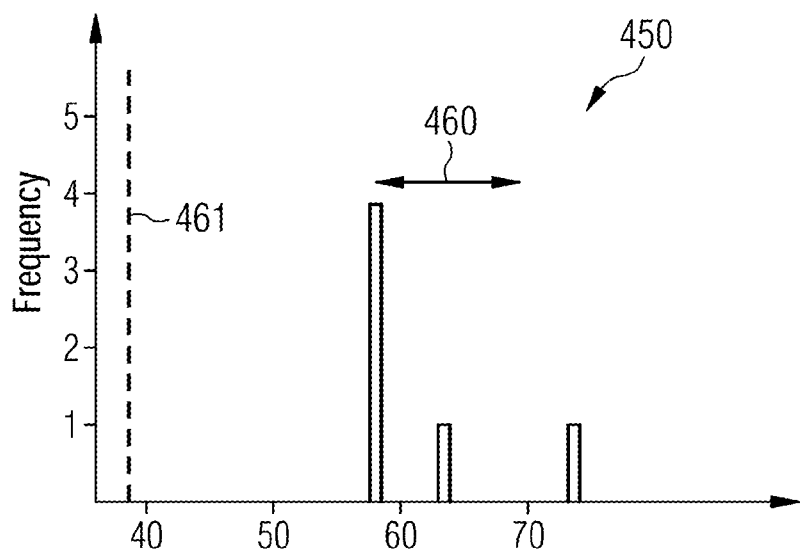
FIG. 13 schematically illustrates the scattering of the local maxima of the integral RF energy as a function of the repetition over the repetition sequence for the dependencies of the flip angles in accordance with FIG. 12.

FIG. 13 illustrates aspects in relation to the scattering 460 of the maxima 450 of the integral RF energy 405 for the dependencies 455 in accordance with FIG. 12. FIG. 13 is a frequency diagram for the values of the maxima 450 of the integral RF energy 405. In FIG. 13 the scattering 460 is plotted. It can be seen from FIG. 13 that the scattering is far lower than an average value 461 of the integral RF energy 405, in particular less than 80% of the average value 461.

Figure 14:
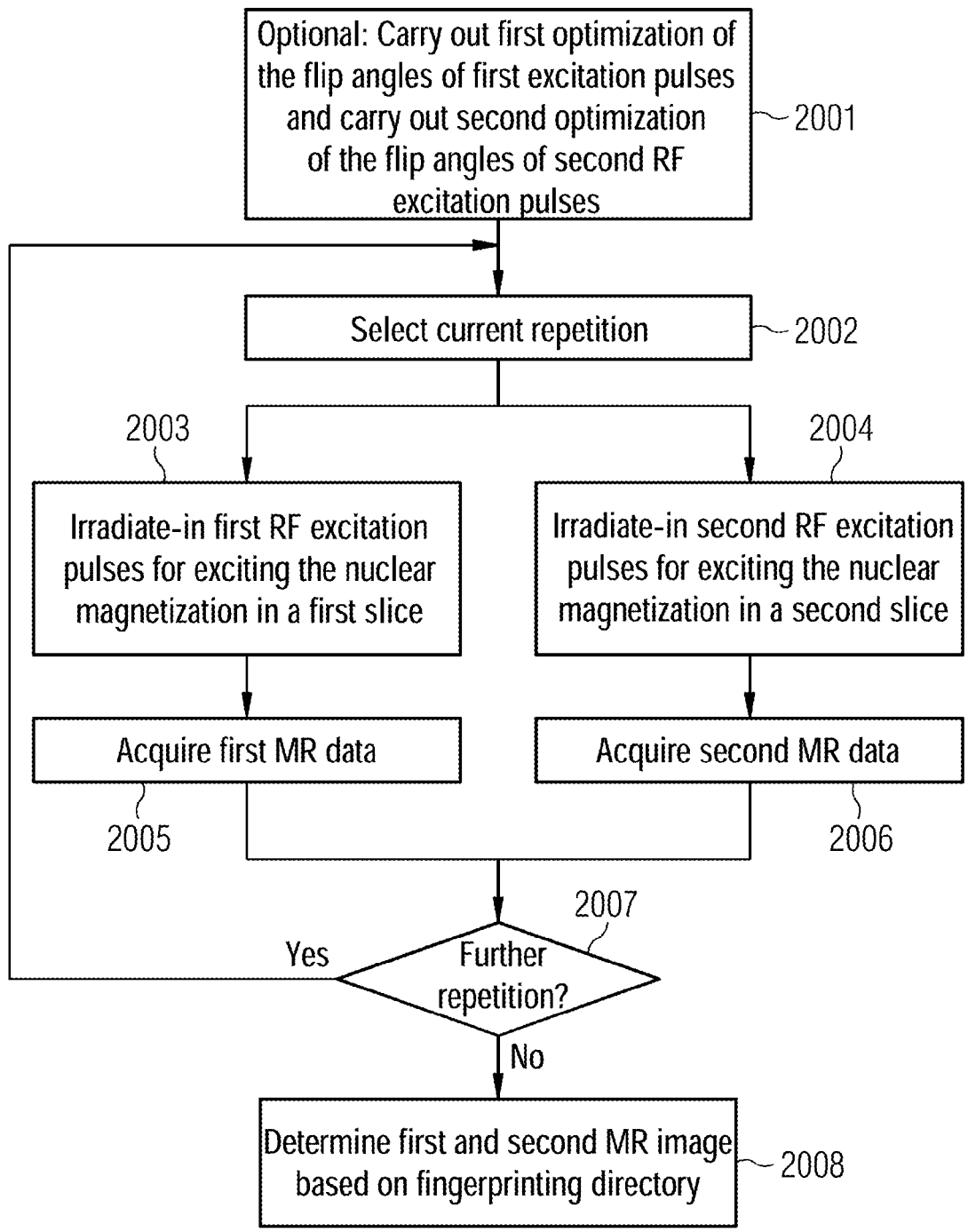
FIG. 14 is a flowchart of an embodiment of the method in accordance with the invention.

FIG. 14 is a flowchart of a method that implements various techniques described herein. In step 2001 an optimization of the flip angles 315 for the different RF excitation pulses 351-353 will optionally be carried out. The flip angles will be defined as optimization variables in this case. The flip angles 315 will be determined here as optimization variables. The optimization can comprise one or more numerical techniques for example, such as those based on the gradient method, the incremental method, an evolutionary algorithm etc. The optimization can take account of different optimization parameters, for example the maximum frequency energy of the repetition sequence 401; the scattering 460 of the integral RF energy 405; the difference 406 between the flip angles 315 of the different RF excitation pulses 351-353; and a signal-to-noise ratio of the MR data 261-263. For example the maximum RF energy of the repetition sequence 401 could be predetermined as a boundary condition. For example a minimum difference 406 between the flip angles 315 of the different RF excitation pulses 351-353 could be predetermined as a boundary condition. The scattering 460 could be minimized.

Subsequently, in step 2002, a current repetition 401, 402 will be selected. Then there is the execution of steps 2003 and 2004, at least partly in parallel in time, in which RF excitation pulses for exciting the nuclear magnetization in the different slices 201-203 will be introduced.

Then there is once again the execution of steps 2005 and 2006, at least partly in parallel in time, in which in each case associated MR data 261-263 will be acquired.

A check is made in step 2007 as to whether a further repetition 401, 402 is present in the repetition sequence 400. If it is, the steps 2002-2006 will be executed again with the further repetition 401, 402.

Otherwise, in step 2008, the MR images 271-273 are determined for the different slices 201-203.

Naturally the features of the forms of embodiment and aspects of the invention described above can be combined with one another. In particular the features can be used not only in the combinations described, but also in other combinations or on their own, without departing from the scope of the invention.

Examples have been illustrated herein, in which MR data will be acquired for two or three slices. In such cases it can be generally possible to acquire MR data for a larger number of slices, e.g. by the techniques described herein will be repeated for further slices. It is also possible for MR data for two, three or more slices to be acquired by techniques of SMS imaging at least partly in parallel in time.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for magnetic resonance (MR) fingerprinting, comprising:

with a computer, operating an MR data acquisition scanner to execute a repetition sequence in a plurality of repetitions and, in each repetition, radiating a first radio-frequency (RF) excitation pulse into an examination subject, situated in the scanner, that excites a magnetization of nuclear spins in a first slice of the subject, and acquiring first MR data resulting from said first RF excitation pulse;

with said computer, operating said scanner, in each repetition, to also radiate a second RF excitation pulse that excites a magnetization of nuclear spins in a second slice of the examination subject, that is different from said first slice, and acquiring second MR data resulting from said second RF excitation pulse;

with said computer, operating said scanner to radiate said first RF excitation pulse and said second RF excitation pulse in the respective repetitions so as to be radiated at least partly in parallel in time and, in at least some of said repetitions, radiating said first RF excitation pulse with flip angle that differs from a flip angle of said second RF excitation pulse;

with said computer, operating said scanner to execute said repetitions of said repetition sequence with a scattering of local maxima of a sum of RF energy of said first RF excitation pulse and said second RF excitation pulse in each repetition, to be less than 80% of an average value of said sum over all of said repetitions of said repetition sequence;

in said computer, determining a first MR image of the first slice based on a fingerprinting directory and said first MR data, and determining a second MR image of the second slice based on said fingerprinting directory and said second MR data; and making the first MR image and the second MR image available in electronic form from said computer as respective data files.

2. A method as claimed in claim 1 comprising, with said computer, operating said scanner to vary the respective flip angles of said first RF excitation pulses in different repetitions, and to vary the respective flip angles of said second RF excitation pulse in different repetitions.

3. A method as claimed in claim 1 comprising, with said computer, operating said scanner to give the flip angle of the first RF excitation pulses in respective repetitions a dependency on the respective repetitions that is complementary to dependency of the respective flip angles of second RF excitation pulses on said respective repetitions.

4. A method as claimed in claim 1 comprising, with said computer, operating said scanner to give the flip angle of the first RF excitation pulses in respective repetitions a dependency on the respective repetitions that correspond to dependency of the respective flip angles of second RF excitation pulses on said respective repetitions.

5. A method as claimed in claim 4 wherein the dependency of the respective flip angles of the first RF excitation pulses on the respective repetitions is described by a first function, and wherein the dependency of the flip angles of the second radio-frequency excitation pulses in the respective repetitions is described by a second function, wherein said first function corresponds to said second function.

6. A method as claimed in claim 5 wherein said first function is equal to said second function multiplied by a scaling factor that is not equal to one.

7. A method as claimed in claim 5 wherein said first function is equal to said second function displaced by at least one repetition.

8. A method as claimed in claim 5 wherein said first and second functions have oscillations with a periodicity that is dependent on the respective repetitions.

9. A method as claimed in claim 1 wherein said scattering of the local maxima of the sum of RF energy of said first RF excitation pulse and said second RF excitation pulse in each repetition is no larger than 50% of said average value of said sum over all of said repetitions of said repetition sequence.

10. A method as claimed in claim 1 wherein a scattering of the sum of the RF energy of the first RF excitation pulse and the RF energy of the second RF excitation pulse in each repetition is less than 20% of an average value of said sum over all of said repetitions of said repetition sequence.

11. A method as claimed in claim 1 wherein a scattering of the sum of the RF energy of the first RF excitation pulse and the RF energy of the second RF excitation pulse in each repetition is less than 8% of an average value of said sum over all of said repetitions of said repetition sequence.

12. A method for magnetic resonance (MR) fingerprinting, comprising:
   with a computer, operating an MR data acquisition scanner to execute a repetition sequence in a plurality of repetitions and, in each repetition, radiating a first radio-frequency (RF) excitation pulse into an examination subject, situated in the scanner, that excites a magnetization of nuclear spins in a first slice of the subject, and acquiring first MR data resulting from said first RF excitation pulse;
   with said computer, operating said scanner, in each repetition, to also radiate a second RF excitation pulse that excites a magnetization of nuclear spins in a second slice of the examination subject, that is different from said first slice, and acquiring second MR data resulting from said second RF excitation pulse;
   with said computer, operating said scanner to radiate said first RF excitation pulse and said second RF excitation pulse in the respective repetitions so as to be radiated at least partly in parallel in time and, in at least some of said repetitions, radiating said first RF excitation pulse with flip angle that differs from a flip angle of said second RF excitation pulse;
   in said computer, implementing a first optimization of the flip angles of the first RF excitation pulses dependent on at least one optimization criterion for said first RF excitation pulses, and implementing a second optimization of the flip angles of the second RF excitation pulses dependent on an optimization criterion for said second RF excitation pulses;
   in said computer, determining a first MR image of the first slice based on a fingerprinting directory and said first MR data, and determining a second MR image of the second slice based on said fingerprinting directory and said second MR data; and
   making the first MR image and the second MR image available in electronic form from said computer as respective data files.

13. A method as claimed in claim 12 comprising selecting at least one of the optimization criterion for said first RF excitation pulses and the optimization criterion for said second optimization pulses from the group consisting of a maximum RF energy of the repetition sequence, a scattering of local maxima of a sum of the RF energy of the first RF excitation pulses and RF energy of said second RF excitation pulses in each repetition over said repetition sequence, a difference between the respective flip angles of the first RF excitation pulses and the flip angles of the second RF excitation pulses for different repetitions, and a signal-to-noise ratio of said first MR data and said second MR data.

14. A method as claimed in claim 12 comprising, with said computer, operating said scanner to vary the respective flip angles of said first RF excitation pulses in different repetitions, and to vary the respective flip angles of said RF excitation pulse in different repetitions.

15. A method as claimed in claim 12 comprising, with said computer, operating said scanner to give the flip angle of the first RF excitation pulses in respective repetitions a dependency on the respective repetitions that is complementary to dependency of the respective flip angles of second RF excitation pulses on said respective repetitions.

16. A method as claimed in claim 12 comprising, with said computer, operating said scanner to give the flip angle of the first RF excitation pulses in respective repetitions a dependency on the respective repetitions that correspond to dependency of the respective flip angles of second RF excitation pulses on said respective repetitions.

17. A method as claimed in claim 16 wherein the dependency of the respective flip angles of the first RF excitation pulses on the respective repetitions is described by a first function, and wherein the dependency of the flip angles of the second radio-frequency excitation pulses in the respective repetitions is described by a second function, wherein said first function corresponds to said second function.

18. A method as claimed in claim 17 wherein said first function is equal to said second function multiplied by a scaling factor that is not equal to one.

19. A method as claimed in claim 17 wherein said first function is equal to said second function by displaced by at least one repetition.

20. A method as claimed in claim 17 wherein said first and second functions have oscillations with a periodicity that is dependent on the respective repetitions.

21. A method as claimed in claim 12 wherein a scattering of the sum of the RF energy of the first RF excitation pulse and the RF energy of the second RF excitation pulse in each repetition is less than 80% of an average value of said sum over all of said repetitions of said repetition sequence.

22. A method as claimed in claim 12 wherein said scattering of the local maxima of the sum of RF energy of said first RF excitation pulse and said second RF excitation pulse in each repetition is no larger than 50% of said average value of said sum over all of said repetitions of said repetition sequence.

23. A magnetic resonance (MR) apparatus comprising:
   an MR data acquisition scanner;
   a computer configured to operate said MR data acquisition scanner to execute a repetition sequence in a plurality of repetitions and, in each repetition, to radiate a first radio-frequency (RF) excitation pulse into an examination subject, situated in the scanner, that excites a magnetization of nuclear spins in a first slice of the subject, and to acquire first MR data resulting from said first RF excitation pulse;
   said computer being configured to operate said scanner, in each repetition, to also radiate a second RF excitation pulse that excites a magnetization of nuclear spins in a second slice of the examination subject, that is different from said first slice, and to acquire second MR data resulting from said second RF excitation pulse;
   said computer being configured to operate said scanner to radiate said first RF excitation pulse and said second RF excitation pulse in the respective repetitions so as to be radiated at least partly in parallel in time and, in at least some of said repetitions, to radiate said first RF excitation pulse with flip angle that differs from a flip angle of said second RF excitation pulse;
   said computer being configured to operate said scanner to execute said repetitions of said repetition sequence with a scattering of local maxima of a sum of RF energy of said first RF excitation pulse and said second RF excitation pulse in each repetition, to be less than 80% of an average value of said sum over all of said repetitions of said repetition sequence;
   said computer being configured to determine a first MR image of the first slice based on a fingerprinting directory and said first MR data, and to determine a second MR image of the second slice based on said fingerprinting directory and said second MR data; and said computer being configured to make the first MR image and the second MR image available in electronic form from said computer as respective data files.

24. A magnetic resonance (MR) apparatus comprising:
an MR data acquisition scanner;
a computer being configured to operate said MR data acquisition scanner to execute a repetition sequence in a plurality of repetitions and, in each repetition, to radiate a first radio-frequency (RF) excitation pulse into an examination subject, situated in the scanner, that excites a magnetization of nuclear spins in a first slice of the subject, and to acquire first MR data resulting from said first RF excitation pulse;
said computer being configured to operate said scanner, in each repetition, to also radiate a second RF excitation pulse that excites a magnetization of nuclear spins in a second slice of the examination subject, that is different from said first slice, and to acquire second MR data resulting from said second RF excitation pulse;
said computer being configured to operate said scanner to radiate said first RF excitation pulse and said second RF excitation pulse in the respective repetitions so as to be radiated at least partly in parallel in time and, in at least some of said repetitions, to radiate said first RF excitation pulse with flip angle that differs from a flip angle of said second RF excitation pulse;
said computer being configured to implement a first optimization of the flip angles of the first RF excitation pulses dependent on at least one optimization criterion for said first RF excitation pulses, and to implement a second optimization of the flip angles of the second RF excitation pulses dependent on an optimization criterion for said second RF excitation pulses;
said computer being configured to determine a first MR image of the first slice based on a fingerprinting directory and said first MR data, and determining a second MR image of the second slice based on said fingerprinting directory and said second MR data; and
said computer being configured to make the first MR image and the second MR image available in electronic form from said computer as respective data files.

* * * * *